(12) United States Patent
Hsu et al.

(10) Patent No.: US 8,970,024 B2
(45) Date of Patent: Mar. 3, 2015

(54) PACKAGES WITH MOLDING MATERIAL FORMING STEPS

(71) Applicant: Taiwan Semiconductor Manufacturing Company, Ltd., Hsin-Chu (TW)

(72) Inventors: Yu-Chen Hsu, Hsin-Chu (TW); Chun-Hung Lin, Taipei (TW); Yu-Feng Chen, Hsin-Chu (TW); Han-Ping Pu, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/906,185

(22) Filed: May 30, 2013

(65) Prior Publication Data

US 2014/0264810 A1   Sep. 18, 2014

Related U.S. Application Data

(60) Provisional application No. 61/782,064, filed on Mar. 14, 2013.

(51) Int. Cl.
*H01L 23/02* (2006.01)
*H01L 23/31* (2006.01)
*H01L 21/56* (2006.01)
*H01L 25/00* (2006.01)
*H01L 23/00* (2006.01)
*H01L 25/10* (2006.01)
*H01L 25/065* (2006.01)

(52) U.S. Cl.
CPC .......... *H01L 23/3128* (2013.01); *H01L 21/566* (2013.01); *H01L 25/50* (2013.01); *H01L 21/561* (2013.01); *H01L 24/97* (2013.01); *H01L 25/105* (2013.01); *H01L 24/08* (2013.01); *H01L 24/14* (2013.01); *H01L 24/16* (2013.01); *H01L 24/80* (2013.01); *H01L 25/0657* (2013.01); *H01L 2224/08225* (2013.01); *H01L 2224/14181* (2013.01); *H01L 2224/16145* (2013.01); *H01L 2224/16225* (2013.01); *H01L 2224/80895* (2013.01); *H01L 2224/97* (2013.01); *H01L 2225/06517* (2013.01); *H01L 2225/1023* (2013.01); *H01L 2225/1058* (2013.01); *H01L 2924/15192* (2013.01); *H01L 2924/15311* (2013.01); *H01L 2924/1533* (2013.01); *H01L 2924/1815* (2013.01); *H01L 2225/06513* (2013.01); *H01L 2225/06565* (2013.01)
USPC .......................................................... 257/686

(58) Field of Classification Search
CPC .. H01L 23/31; H01L 23/3107; H01L 23/3128
USPC .......................................................... 257/686
See application file for complete search history.

(56) References Cited

U.S. PATENT DOCUMENTS

2008/0073769 A1 * 3/2008 Wu et al. ................... 257/686
2009/0057918 A1 * 3/2009 Kim ........................... 257/777

(Continued)

*Primary Examiner* — Long K Tran
(74) *Attorney, Agent, or Firm* — Slater & Matsil, L.L.P.

(57) ABSTRACT

A package includes a first package component having a top surface, a second package component bonded to the top surface of the first package component, and a plurality of electrical connectors at the top surface of the first package component. A molding material is over the first package component and molding the second package component therein. The molding material includes a first portion overlapping the second package component, wherein the first portion includes a first top surface, and a second portion encircling the first portion and molding bottom portions of the plurality of electrical connectors therein. The second portion has a second top surface lower than the first top surface.

20 Claims, 8 Drawing Sheets

(56) References Cited

U.S. PATENT DOCUMENTS

| | | | |
|---|---|---|---|
| 2009/0261465 A1* | 10/2009 | Shinagawa | 257/686 |
| 2011/0024904 A1* | 2/2011 | Egawa | 257/738 |
| 2011/0117700 A1* | 5/2011 | Weng et al. | 438/109 |
| 2011/0233747 A1* | 9/2011 | Lee et al. | 257/686 |
| 2013/0037944 A1* | 2/2013 | Lee et al. | 257/737 |

* cited by examiner

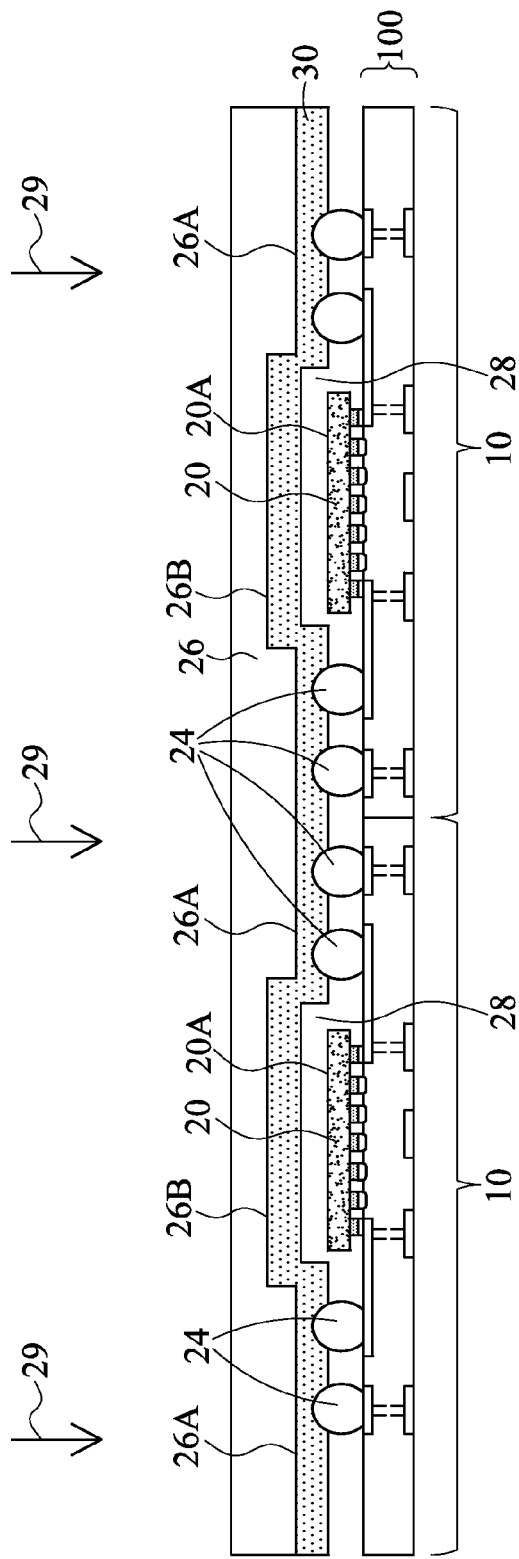
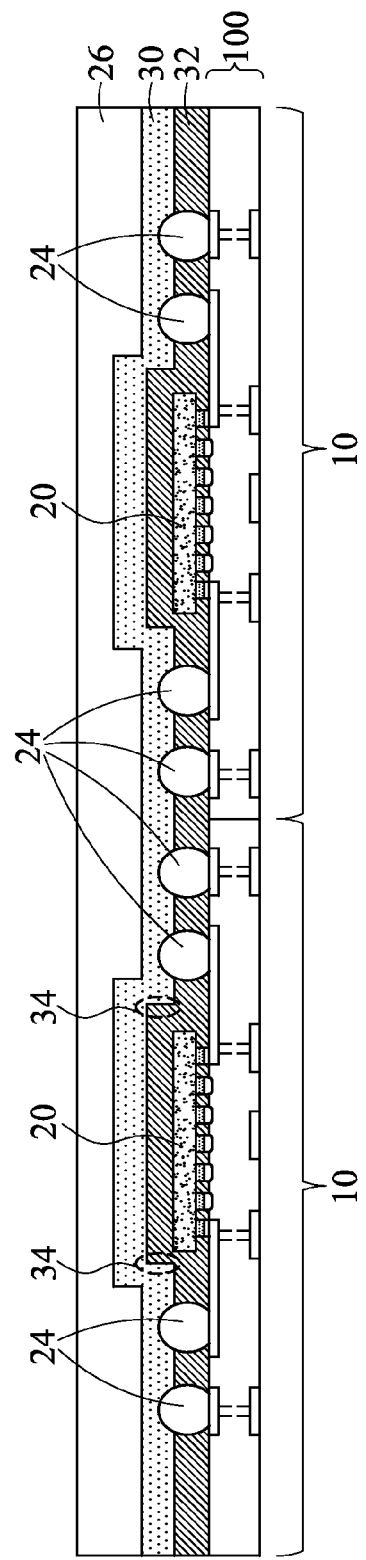
Fig. 4
Fig. 5A

PACKAGES WITH MOLDING MATERIAL FORMING STEPS

This application claims the benefit of U.S. Provisional Application No. 61/782,064, filed Mar. 14, 2013, and entitled "Packages with Molding Material Forming Steps," which application is hereby incorporated herein by reference.

BACKGROUND

In a conventional package-on-package (POP) process, a top package, in which a first device die is bonded, is further bonded to a bottom package through solder balls. The bottom package may also include a second device die bonded therein. The second device die may be on the same side of the bottom package as the solder balls.

Before the bonding of the top package to the bottom package, a molding compound is applied on the bottom package, with the molding compound covering the second device die and the solder balls. Since the solder balls are buried in the molding compound, a laser ablation or drilling is performed to form holes in the molding compound, so that the solder balls are exposed. The top package and the bottom package may then be bonded through the solder balls in the bottom package. In addition, the molding compound may be filled into the space between the second device die and a package substrate in the bottom package. Since the space between the second device die and the package substrate in the bottom package is small, a void may be adversely generated in the space, which results in stress to the second device die.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1A through 8 are cross-sectional views and top views of intermediate stages in the manufacturing of a package-on-package structure in accordance with some exemplary embodiments.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A package and the method of forming the same are provided in accordance with various embodiments. The intermediate stages of forming the packages are illustrated in accordance with some embodiments. The variations of the embodiments are discussed. Throughout the various views and illustrative embodiments, like reference numbers are used to designate like elements.

Figure 1A:
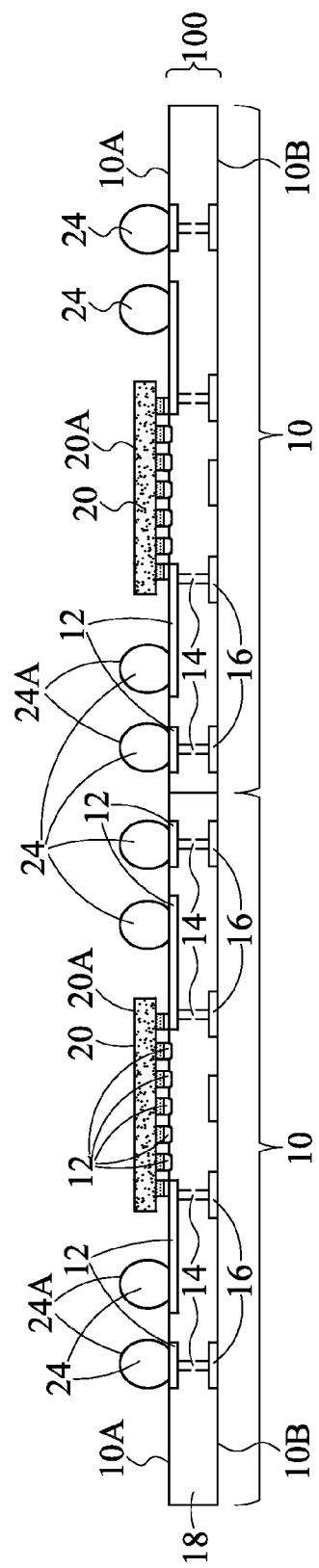
Figure 1B:
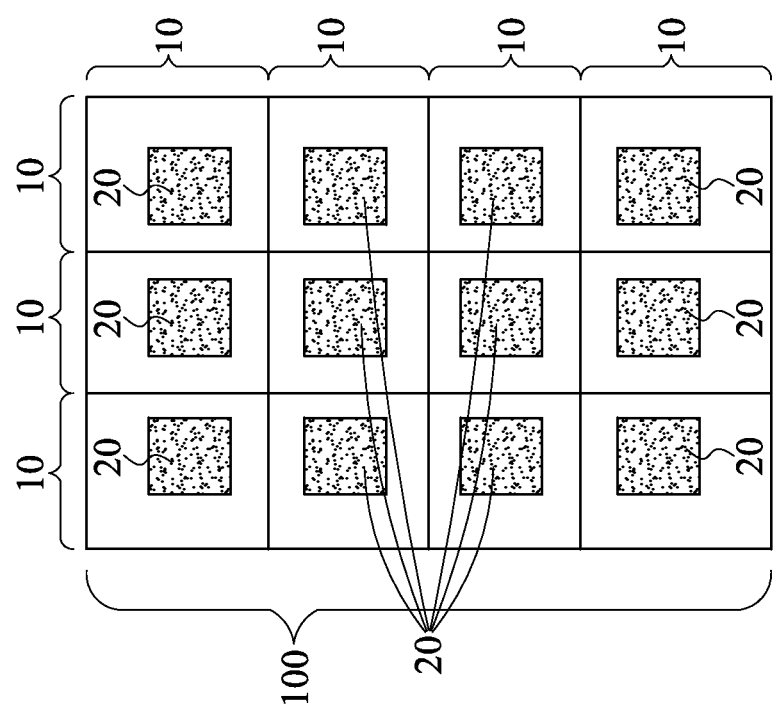

Referring to FIG. 1A, package substrates 10 are provided. Package substrates 10 may be parts of package substrate strip 100. For example, FIG. 1B illustrates a top view of exemplary package substrate strip 100, which includes a plurality of package substrates 10 arranged as an array. Throughout the description, although reference numeral 10 refers to package substrates, it may also be used to refer to other types of package components such as interposers. Throughout the description, package substrates 10 are alternatively referred to as first package components.

Referring back to FIG. 1A, package substrates 10 may include substrates 18 that are formed of a dielectric material. Alternatively, substrates 18 may be formed of a semiconductor material such as silicon. In some embodiments, substrates 18 are laminate substrates, which include a plurality of dielectric films adhered together through lamination. In alternative embodiments, substrates 18 are build-up substrates. When substrates 18 are formed of dielectric materials, the dielectric materials may comprise composite materials that are mixed with glass fiber and/or resin. Package substrates 10 are configured to electrically couple electrical connectors 12 on first surface 10A to conductive features 16 on second surface 10B, wherein surfaces 10A and 10B are opposite surfaces of package substrates 10. Conductive features 16 may be metal pads, for example. Package substrates 10 further include conductive connections such as metal lines/vias 14 therein. Alternatively, features 14 comprise through-vias penetrating through substrates 18.

Device dies 20 are bonded to package substrates 10 through electrical connectors 12. Dies 20 may be circuit dies comprising integrated circuit devices (not shown) such as transistors, capacitors, inductors, resistors, and the like. Dies 20 may also be logic dies such as Central Computing Unit (CPU) dies. The bonding of dies 20 to electrical connectors 12 may be through solder bonding or direct metal-to-metal bonding (such as copper-to-copper bonding). Throughout the description, device dies 20 are alternatively referred to as second package components.

Electrical connectors 24 are formed on top surfaces 10A of package substrates 10. Electrical connectors 24 are electrically coupled to, and may be in physical contact with, electrical connectors 12 and conductive features 16. In some embodiments, electrical connectors 24 are solder balls. In alternative embodiments, electrical connectors 24 comprise metal pads, metal pillars, solder caps formed on metal pillars, and/or the like. The solder regions (such as solder balls or the reflowed solder caps) of electrical connectors 24 may have round top surfaces, although the top surfaces of the solder regions may also be planar. Electrical connectors 24 are not covered by dies 20. In some embodiments, top ends 24A of electrical connectors 24 are higher than top surfaces 20A of dies 20. In alternative embodiments, top ends 24A of electrical connectors 24 are substantially level with, or lower than, top surfaces 20A of dies 20.

Figure 2:
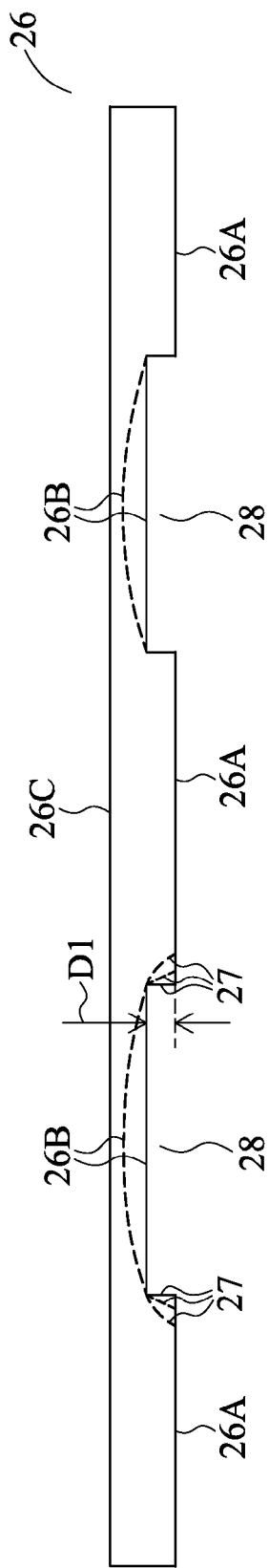

Referring to FIG. 2, mold chase 26 is provided. Mold chase 26 may be formed of stainless steel, aluminum, copper, ceramic, or other materials. Recesses 28 are formed in mold chase 26. Recesses 28 may form an array in a top view of mold chase 26, wherein the locations and the sizes of recesses 28 correspond to the locations and the sizes of dies 20 (FIG. 1B). In some embodiments, depth D1 of recesses 28 are greater than about 30 μm or greater than about 50 μm. It is appreciated, however, that the values recited throughout the description are merely examples, and may be changed to different values. Mold chase 26 thus includes surfaces 26A outside of recesses 28, and surfaces 26B inside recesses 28. In some embodiments, as shown in FIG. 2, surfaces 26A and 26B are substantially planar surfaces. In alternative embodiments, surfaces 26A and 26B may have other shapes. For example, surfaces 26B may be curved, as indicated by dashed lines. Recesses 28 also have sidewalls 27. In some embodiments, sidewalls 27 are straight vertical sidewalls perpendicular to surfaces 26A and/or 26B. In alternative embodiments, sidewalls 27 are slanted, as shown by dashed line. In yet alternative embodiments, sidewalls 27 may also be curved, as also illustrated using dashed lines.

Figure 3:
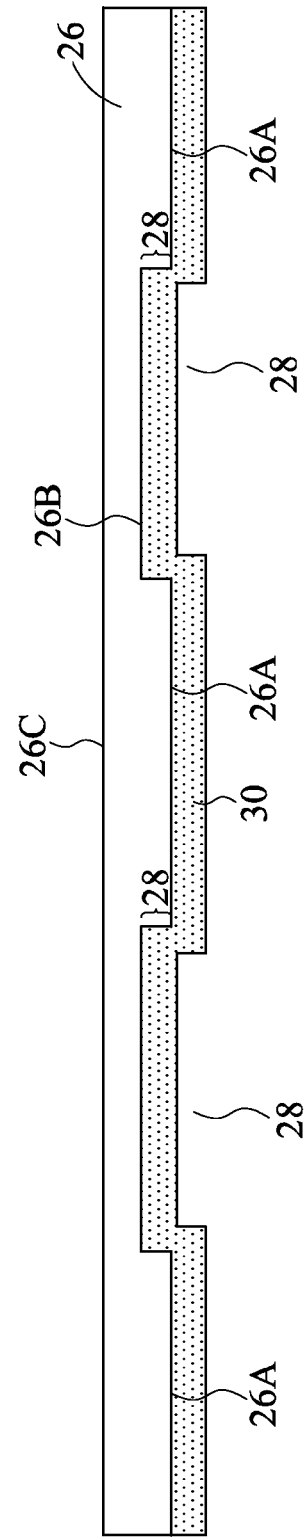

Referring to FIG. 3, a blanket release film 30 is adhered to mold chase 26. The resulting release film 30 includes portions outside of recesses 28, and portions extending into recesses 28. Release film 30 is formed of a relatively soft material, so that when solder balls are pressed into it, the solder balls are not damaged, and the solder balls may substantially maintain their shapes. For example, release film 30 may be a fluorine-base film, a silicon-coated polyethylene terephthalate film, a polymethylpentene film, a polypropylene film, or the like. Mold chase 26 may comprise small through-holes (not shown) extending from top surface 26C to surfaces 26A and 26B, so that air may be evacuated from the through-holes, and release film 30 may have good contact with the sidewalls of mold chase 26 (which sidewalls are in recesses 28) and the bottom surfaces 26A and 26B of mold chase 26. Accordingly, substantially no air bubble is formed between release film 30 and mold chase 26. Release film 30 also forms cavities following the profile of recesses 28, which cavities are also shown as recesses 28.

Referring to FIG. 4, mold chase 26 and release film 30 are placed over package substrate strip 100. The centers of dies 20 may be aligned to the centers of recesses 28 in mold chase 26. In some embodiments, top surfaces 20A of dies 20 are higher than surfaces 26A of mold chase 26, and hence dies 20 partially extend into recesses 28. In alternative embodiments, top surface 20A of dies 20 are lower than surfaces 26A of mold chase 26, and hence dies 20 are outside of recesses 28. Mold chase 26 and release film 30 are pressed against package substrate strip 100, wherein arrows 29 represent the pressing force. The top portions of electrical connectors 24 are hence pressed into release film 30. The bottom portion of each of electrical connectors 24 remains outside of release film 30.

Figure 5B:
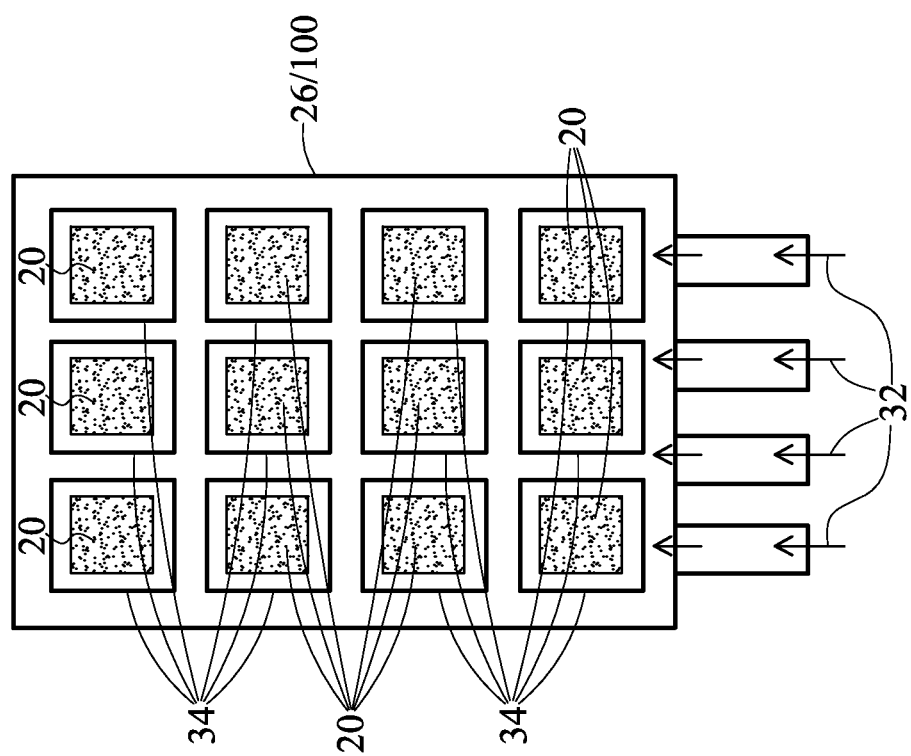

Referring to FIGS. 5A and 5B, molding material 32, which is in a liquid form, is injected into the space between release film 30 and package substrate strip 100. Molding material 32 may be a Molding Underfill (MUF) in some embodiments, although other types of polymers/resins may also be used. Molding material 32 fills the gaps between dies 20 and release film 30 and the spaces between dies 20 and package substrate strip 100. Also, molding material 32 encircles, and is in contact with, electrical connectors 24. As shown in FIG. 5B, which is a top view of the structure in FIG. 5A, molding material 32 is injected from one side of package substrate strip 100, and flows to the other side. Eventually, molding material 32 fills the entire space between release film 30/mold chase 26 and package substrate strip 100. After the injection of molding material 32, molding material 32 is cured and solidified.

Figure 6:
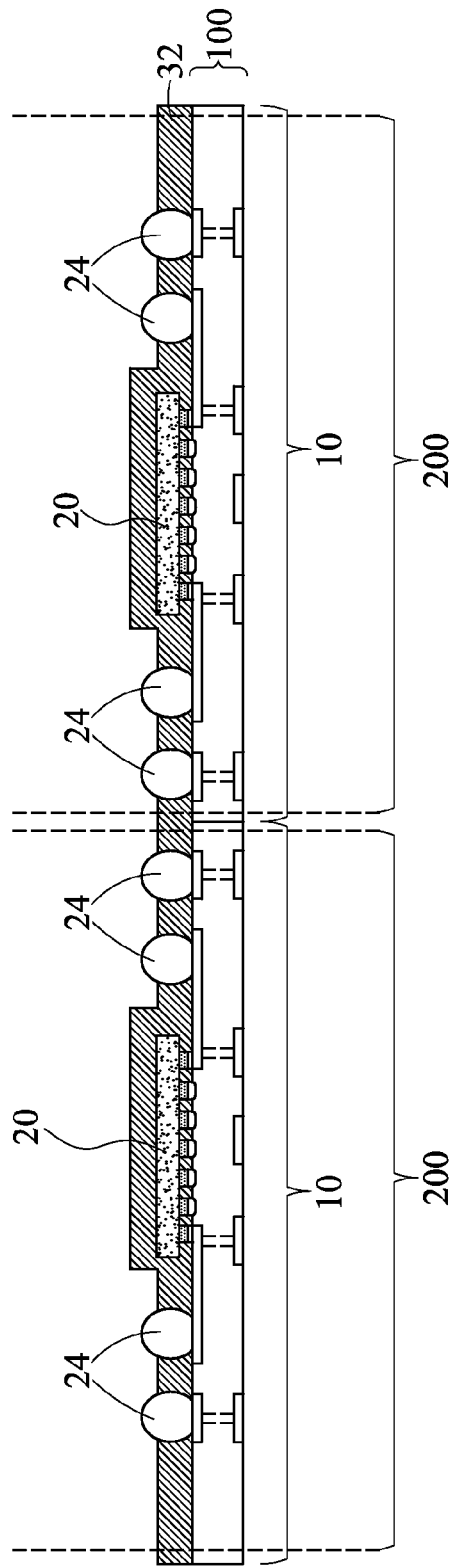

Referring to FIG. 6, mold chase 26 and release film 30 are removed. The structure shown in FIG. 6 is then sawed apart into a plurality of packages 200, as shown in FIG. 7. Each of packages 200 includes one of package substrates 10, one of dies 20, and the respective overlying portion of molding material 32. Throughout the description, packages 200 are referred to as bottom packages.

Figure 7A:
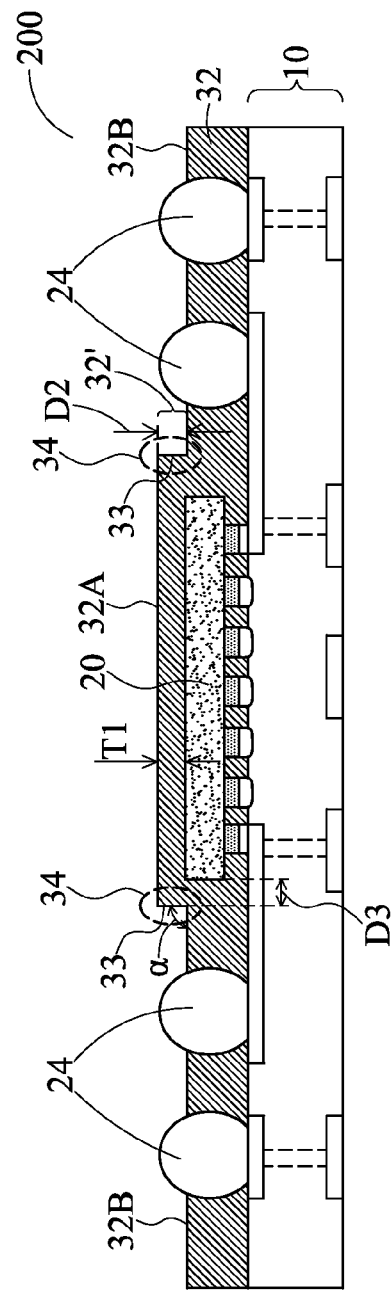
Figure 7B:
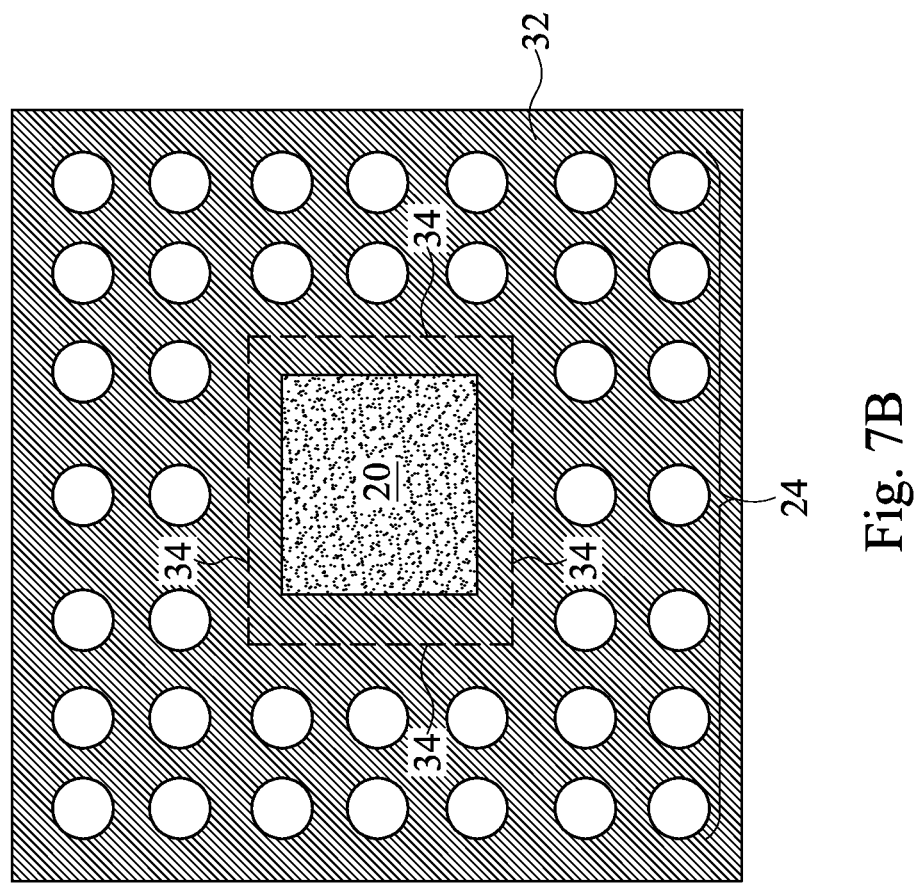
Figure 8:
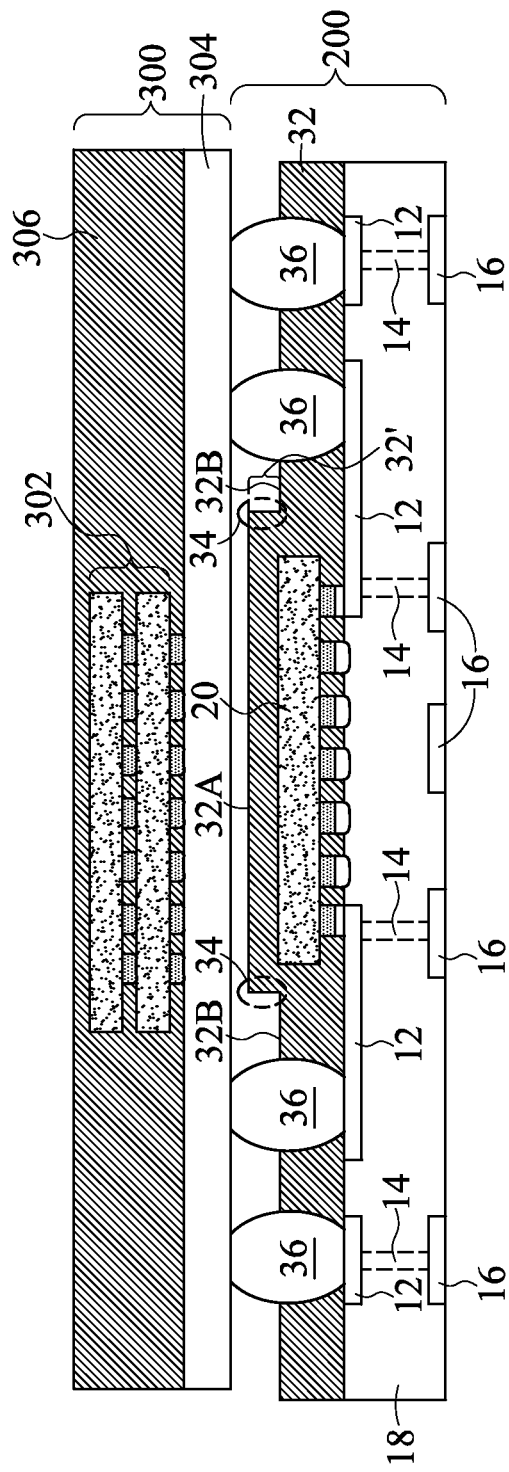

FIGS. 7A and 7B illustrate a cross-sectional view and a top view, respectively, of bottom package 200. As shown in FIG. 7A, in the resulting bottom package 200, molding material 32 comprises first portions 32' overlapping dies 20. Thickness T1 of the first portion 30' may be greater than about 30 µm, although thickness T1 may also be smaller than about 30 µm. Thickness T1 is also selected so that in the subsequent packaging step as shown in FIG. 8, the molding material portion 32' does not prevent electrical connectors 24 from being joined to the respective top package 300. As shown in FIG. 7A, die 20 is molded using an over-mold scheme. On the other hand, electrical connectors 24 have their top portions exposed out of molding material 32. Hence, electrical connectors 24 are molded using an exposed-mold scheme. Molding material 32 includes surfaces 32A and 32B, which are interconnected by sidewalls 33 of molding material 32. Surfaces 32A and 32B and sidewalls 33 thus form steps. Surfaces 32A and 32B may comprise substantially planar portions that are substantially parallel to each other. Furthermore, since surfaces 32A and 32B are defined by the bottom surfaces of the same release film 30 (FIG. 5A), surfaces 32A and 32B will have a same surface roughness. The height difference D2 between surfaces 32A and 32B, which height difference D2 is also the height of steps 34, may be greater than about 30 µm. Furthermore, in some embodiments, surface 32A has an area larger than the area of die 20, and may laterally extend beyond the edges of the die 20 by distance D3, which is a non-zero value. In some exemplary embodiments, distance D3 is greater than about 30 µm. Accordingly, steps 34 are located between the edges of dies 20 and the respective nearest electrical connectors 24. FIG. 7B illustrates a top view of the structure in FIG. 7A. In some embodiments, step 34 is substantially vertical. In alternative embodiments, step 34 is slanted, with the lower portions of molding material portion 32' wider than the respective upper portions. Slant angle α may be between 90 degrees and about 135 degrees, for example, although slant angle α may be greater. The corners of step 34 may be rounded or form substantially straight angles.

As shown in FIG. 7B, step 34 may form a ring encircling die 20. Electrical connectors 24 are disposed outside the ring formed of steps 34, and may also be aligned to a plurality of rings that encircles the ring of steps 34.

In alternative embodiments in which electrical connectors 24 have flat surfaces, in the molding of molding material 32 (the step shown in FIGS. 5A and 5B), release film 30 may not be used. Instead, mold chase 26 may contact the top surfaces of electrical connectors 24. In the resulting structure in accordance with these embodiments, top surfaces 32B (FIG. 7A) of molding material 32 will be level with the flat top surfaces of electrical connectors 24, wherein the flat top surfaces of electrical connectors 24 are exposed through molding material 32.

FIG. 8 illustrates the bonding of top package 300 to bottom package 200. In the bonding process, top package 300 is first placed against bottom package 200. Top package 300 may be a package that includes device dies 302 and package substrate 304, wherein device dies 302 are bonded to package substrate 304. In some exemplary embodiments, device dies 302 comprise memory dies such as Static Random Access Memory (SRAM) dies, Dynamic Random Access Memory (DRAM) dies, or the like. Furthermore, before the bonding of top package 300 to bottom package 200, molding material 306 may be pre-molded on device dies 302 and package substrate 304. In some embodiments, top package 300 includes solder regions (not shown) that are aligned to electrical connectors 24 (FIG. 7A). After a reflow process, the solder regions in top package 300 are merged with the solder in electrical connectors 24 to form solder regions 36, which join top package 300 to bottom package 200.

In the embodiments of the present disclosure, the molding material is molded using a hybrid scheme, wherein the dies in the bottom packages are molded in the molding material. Hence, the dies are molded using an over-mold scheme. The electrical connectors of the bottom packages, however, are molded using an expose-mold scheme. Advantageously, with the over-molding of the dies, more molding material may be disposed in the bottom package. The molding material may contract (for example, during the curing process) after being molded, and hence has the effect of reducing the warpage of the bottom packages. As a result, using more molding material in the bottom package may reduce the warpage more. On the other hand, by using exposed-mold for the electrical connectors in the bottom packages, the sizes of the electrical connectors in the bottom packages may be reduced, and the pitches of the electrical connectors in the bottom packages may be reduced. Furthermore, to achieve the exposed-mold, the height of the molding material surrounding the electrical connectors is reduced. Accordingly, in the molding process, the channels for molding material to flow around the electrical connectors become smaller. This forces the molding material to flow through the spaces between the dies and the package substrates in the bottom packages, and hence the likelihood of forming voids in the spaces between the dies and the package substrates is reduced.

In accordance with some embodiments, a package includes a first package component having a top surface, a second package component bonded to the top surface of the first package component, and a plurality of electrical connectors at the top surface of the first package component. A molding material is over the first package component and molding the second package component therein. The molding material includes a first portion overlapping the second package component, wherein the first portion includes a first top surface, and a second portion encircling the first portion and molding bottom portions of the plurality of electrical connectors therein. The second portion has a second top surface lower than the first top surface.

In accordance with other embodiments, a package includes a package substrate, which includes first metal pads at a top surface of the package substrate, second metal pads at a bottom surface of the package substrate, and conductive connections interconnecting the first metal pads to the second metal pads. A die is over and bonded to the first metal pads. A plurality of electrical connectors is over and bonded to the package substrate. A molding material is molded over the package substrate. The molding material has a first top surface and a second top surface encircling the first top surface in a top view of the package, wherein the second surface is lower than the first top surface.

In accordance with yet other embodiments, a method includes bonding a plurality of dies to a plurality of package substrates of a package substrate strip, and placing a mold chase over the package substrate strip. The mold chase has a plurality of recesses, each aligned to one of the plurality of dies. The mold chase further includes first bottom surfaces in the plurality of recesses, and second bottom surfaces outside of, and between, the plurality of recesses, wherein the second bottom surfaces are lower than the first bottom surfaces. The method further includes injecting a molding material into a space between the mold chase and the package substrate strip, curing the molding material, and removing the mold chase.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A package comprising:
   a first package component comprising a top surface;
   a second package component bonded to the top surface of the first package component;
   a plurality of electrical connectors at the top surface of the first package component; and
   a molding material over the first package component and molding the second package component therein, wherein the molding material comprises:
      a first portion overlapping the second package component, wherein the first portion comprises a first top surface; and
      a second portion encircling the first portion and molding bottom portions of the plurality of electrical connectors therein, wherein the second portion comprises a second top surface lower than the first top surface, with the first top surface and the second top surface having a same surface roughness.

2. The package of claim 1, wherein the molding material further comprises a sidewall connecting the first top surface to the second top surface, wherein the first top surface, the sidewall, and the second top surface form a step.

3. The package of claim 2, wherein the step forms a ring encircling the second package component.

4. The package of claim 2, wherein the step has a height greater than about 30 µm.

5. The package of claim 2, wherein the sidewall is not perpendicular to the second top surface.

6. The package of claim 1, wherein the plurality of electrical connectors further comprises top portions above the second top surface of the second portion of the molding material.

7. The package of claim 1, wherein the first portion has a top-view area greater than a top view area of the second package component, and wherein edges of the first portion of the molding material extend beyond edges of the second package component.

8. The package of claim 1, wherein the first portion of the molding material has a thickness greater than about 30 µm.

9. A package comprising:
   a package substrate comprising:
      first metal pads at a top surface of the package substrate;
      second metal pads at a bottom surface of the package substrate; and
      conductive connections interconnecting the first metal pads to the second metal pads;
   a die over and bonded to the first metal pads;
   a plurality of electrical connectors over and bonded to the package substrate, wherein each of the plurality of electrical connectors comprises:

a round top surface; and
a round sidewall smoothly and continuously connected to the round top surface with no abrupt change;
a molding material molded over the package substrate, wherein the molding material comprises:
a first top surface; and
a second top surface encircling the first top surface in a top view of the package, wherein the second surface is lower than the first top surface and the round top surface of the each of the plurality of electrical connectors, wherein the first top surface and the second top surface of the molding material have a same surface roughness, and wherein the second surface has a corner in contact with the sidewall of one of the plurality of electrical connectors.

10. The package of claim 9, wherein the first top surface comprises a center portion overlapping the die.

11. The package of claim 10, wherein the first top surface further comprises an outer portion encircling the center portion of the first top surface, wherein the outer portion is misaligned with the die.

12. The package of claim 9, wherein the second top surface encircles each of the plurality of electrical connectors.

13. The package of claim 9, wherein the first top surface and the second top surface form a step, and wherein the step forms a ring encircling the die.

14. The package of claim 13, wherein the step has a height greater than about 30 μm.

15. The package of claim 9 further comprising a top package over the molding material, wherein the top package is bonded to the package substrate through the plurality of electrical connectors.

16. The package of claim 9, wherein the molding material further comprises a sidewall connecting the first top surface to the second top surface, with the sidewall not perpendicular to the second top surface.

17. A package comprising:
a package substrate component comprising a top surface;
a device die component bonded to the top surface of the package substrate;
a plurality of electrical connectors at the top surface of the package substrate; and
a molding material over the package substrate and molding the device die therein, wherein the molding material comprises:
a first portion overlapping the device die, wherein the first portion comprises a first top surface;
a second portion encircling the first portion and molding bottom portions of the plurality of electrical connectors therein, wherein the second portion comprises a second top surface lower than the first top surface, and the first top surface and the second top surface have a same surface roughness; and
a sidewall connecting the first top surface to the second top surface, wherein the first top surface, the sidewall, and the second top surface form a step, and the sidewall is slanted.

18. The package of claim 17, wherein the sidewall and the second surface form an angle between 90 degrees and about 135 degrees.

19. The package of claim 17, wherein the step forms a ring encircling the device die.

20. The package of claim 17, wherein the step has a height greater than about 30 μm.

* * * * *